United States Patent
Hong

(10) Patent No.: US 10,622,587 B2
(45) Date of Patent: Apr. 14, 2020

(54) PACKAGING STRUCTURE OF OLED DEVICE AND OLED DEVICE

(71) Applicant: BOE TECHNOLOGY GROUP CO., LTD., Beijing (CN)

(72) Inventor: Rui Hong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/992,880

(22) Filed: May 30, 2018

(65) Prior Publication Data

US 2019/0058162 A1    Feb. 21, 2019

(30) Foreign Application Priority Data

Aug. 18, 2017    (CN) .......................... 2017 1 0713633

(51) Int. Cl.
*H01L 51/52* (2006.01)
*H01L 51/00* (2006.01)
*H01L 51/56* (2006.01)

(52) U.S. Cl.
CPC ...... *H01L 51/5256* (2013.01); *H01L 51/0097* (2013.01); *H01L 51/56* (2013.01); *H01L 2251/303* (2013.01); *H01L 2251/5338* (2013.01)

(58) Field of Classification Search
CPC .. H01L 51/4256; H01L 51/0097; H01L 51/56
See application file for complete search history.

(56) References Cited

U.S. PATENT DOCUMENTS

| 6,146,225 A | 11/2000 | Sheats et al. |
| 2011/0097533 A1* | 4/2011 | Li .......................... C23C 16/029 428/68 |
| 2012/0098026 A1* | 4/2012 | Kwack ................ H01L 51/5253 257/100 |
| 2013/0244079 A1* | 9/2013 | Mandlik ............. H01L 51/5253 429/122 |

FOREIGN PATENT DOCUMENTS

| CN | 101730949 A | 6/2010 |
| CN | 104078587 A | 10/2014 |
| CN | 104078590 A | 10/2014 |
| CN | 104103768 A | 10/2014 |

OTHER PUBLICATIONS

First Office Action for Chinese Patent Application No. 201710713633.0 dated Aug. 2, 2018.

\* cited by examiner

*Primary Examiner* — Matthew L Reames
(74) *Attorney, Agent, or Firm* — Calfee, Halter & Griswold LLP

(57) ABSTRACT

The present disclosure provides a packaging structure of the OLED device and an OLED device. The packaging structure of the OLED device encapsulates an OLED light-emitting structure of the OLED. The packaging structure includes an inorganic barrier layer, an organic sealing layer and a sacrificial protective layer. The organic sealing layer is laminated with the inorganic barrier layer. The sacrificial protective layer is disposed on one side of the organic sealing layer far away from the OLED light-emitting structure, and the sacrificial protective layer is in close contact with the side of the organic sealing layer.

8 Claims, 1 Drawing Sheet

PACKAGING STRUCTURE OF OLED DEVICE AND OLED DEVICE

CROSS REFERENCE

This application is based upon and claims priority to Chinese Patent Application No. 201710713633.0, filed on Aug. 18, 2017, the entire contents thereof are incorporated herein by reference.

TECHNICAL FIELD

The present disclosure belongs to a display technical field, and in particular to a packaging structure of an OLED device and an OLED device.

BACKGROUND

Organic Light-Emitting Diodes (OLEDs) are promising in the display technical field due to the advantages thereof. However, active metals for forming a metal cathode in the OLED device are very sensitive to vapor and oxygen in air, and are very easy to react with the vapor that has been permeated, to affect injection of a charge. In addition, vapor and oxygen that are permeated also react chemically with organic materials. These reactions are primary factors that cause performance degradation of the OLED device and shorten service life of the OLED device. Therefore, packaging technology is very important for OLED devices.

SUMMARY

According to one aspect of the present disclosure, it is provided with a packaging structure of an OLED device. The packaging structure of the OLED device encapsulates an OLED light-emitting structure of the OLED device. The packaging structure includes an inorganic barrier layer, an organic sealing layer and a sacrificial protective layer. The organic sealing layer is laminated with the inorganic barrier layer. The sacrificial protective layer is disposed on one side of the organic sealing layer far away from the OLED light-emitting structure, and the sacrificial protective layer is in close contact with the side of the organic sealing layer.

According to one embodiment of the present disclosure, the inorganic barrier layer includes a first inorganic barrier layer and a second inorganic barrier layer that are spaced apart from each other. The first inorganic barrier layer, the organic sealing layer, the sacrificial protective layer and the second inorganic barrier layer are orderly laminated to one another.

According to one embodiment of the present disclosure, the inorganic barrier layer includes a first inorganic barrier layer, a second inorganic barrier layer, and a third inorganic barrier layer that are spaced apart from one another. The organic sealing layer includes a first organic sealing layer and a second organic sealing layer that are spaced apart from one another. The sacrificial protective layer includes a first sacrificial protective layer and a second sacrificial protective layer that are spaced apart from each other. The first inorganic barrier layer, the first organic sealing layer, the first sacrificial protective layer, the second inorganic barrier layer, the second sacrificial protective layer, and the third inorganic barrier layer which are orderly laminated with one another.

According to one embodiment of the present, at least one of density, hardness, and elasticity modulus of the sacrificial protective layer are greater than at least one of density, hardness, and elasticity modulus of the organic sealing layer.

According to one embodiment of the present disclosure, the sacrificial protection layer is made of an organic material; the organic material comprises HMDSO.

According to one embodiment of the present, the sacrificial protection layer is formed by a PECVD.

According to one embodiment of the present, the sacrificial protective layer is made of the organic material; the organic material comprises an acrylic or an epoxy resin; and the sacrificial protective layer is formed by an inkjet printing.

According to one embodiment of the present, a length of the sacrificial protective layer is greater than a length of the organic sealing layer by 10 μm to 50 μm; a width of the sacrificial protective layer is greater than a width of the organic sealing layer by 10 μm to 50 μm; and a thickness of the sacrificial protective layer is in a range of 1 μm-4 μm.

According to one embodiment of the present, the inorganic barrier layer is made of an aluminum oxide or a zirconium oxide.

According to one embodiment of the present, the inorganic barrier layer is formed by means of ALD.

According to one embodiment of the present, the inorganic barrier layer is made of one or more materials of SiNx, SiON and SiO.

According to one embodiment of the present, the inorganic barrier layer is formed by the PECVD.

According to one embodiment of the present, the organic sealing layer is made of the acrylic.

According to one embodiment of the present, the organic sealing layer is formed by an inkjet printing.

According to another aspect of the present disclosure, it is provided with an OLED device. The OLED device includes an OLED light-emitting structure and a packaging structure of the OLED device encapsulating the OLED light-emitting structure. The packaging structure includes an inorganic barrier layer, an organic sealing layer and a sacrificial protective layer. The organic sealing layer is laminated with the inorganic barrier layer. The sacrificial protective layer is disposed on one side of the organic sealing layer far away from the OLED light-emitting structure, and the sacrificial protective layer is in close contact with the side of the organic sealing layer.

DETAILED DESCRIPTION

It should be appreciated for the person skilled in the art, the packaging structure of an OLED device and the OLED device of the present disclosure will be further described in detail below in conjunction with the accompanying drawings and specific implementations.

In a flexible OLED packaging structure, in a thin film encapsulation ("TFE") in which a multilayer organic sealing layer and an inorganic barrier layer are alternately laminated, when the inorganic barrier layer is deposited by using a plasma enhanced chemical vapor deposition ("PECVD") method, a particle energy is up to 100 ev or more, which will damage a surface of an underlying organic sealing layer such that an originally stable chemical-valence bond structure occurs defects. Such defects can affect a sealing effect and lead to quick penetration of water and oxygen, thusly reducing the service life of the OLED device.

Therefore, a technical problem urgently to be solved at present is to improve the packaging structure of the OLED device so as to achieve a better package effect of the OLED device.

The present disclosure provides a packaging structure of an OLED device, which encapsulates an OLED light-emitting structure of the OLED device. The packaging structure includes an inorganic barrier layer, an organic sealing layer, and a sacrificial protective layer.

The organic sealing layer and the inorganic barrier layer are laminated. The sacrificial protective layer is disposed on one side of the organic sealing layer far away from the OLED light-emitting structure, and the sacrificial protective layer is in close contact with the side of the organic sealing layer.

The packaging structure of the OLED device of the present disclosure includes the sacrificial protective layer that is in close contact with and disposed on one side of the organic sealing layer far away from the OLED light-emitting structure. The organic sealing layer is used to cover particles generated in a manufacturing process of the OLED device to reduce packaging defects caused by the particulate impurities. The sacrificial protective layer is in close contact with and disposed on the organic sealing layer, to avoid surface damage or carbonization caused by bombardment of high-energy particles against the organic sealing layer in subsequent manufacturing processes.

The First Embodiment

This embodiment provides a packaging structure of an OLED device. The packaging structure of the OLED device has a better effect of packaging the OLED device.

Figure 1:
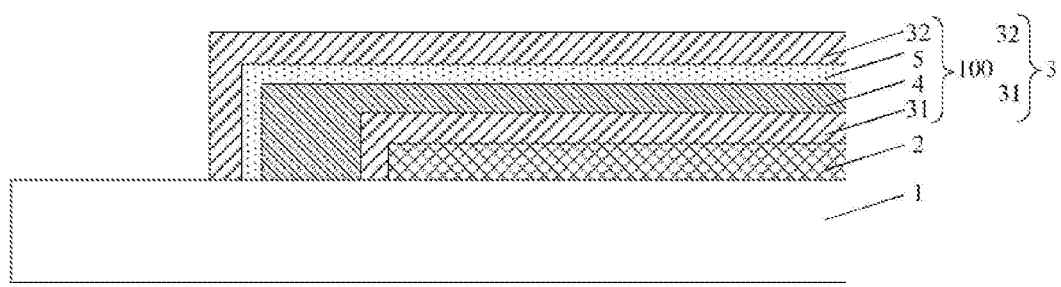
FIG. 1 is a schematic structural view of an OLED device according to a first embodiment of the present disclosure.

As shown in FIG. 1, in the packaging structure 100 of the OLED device, an inorganic barrier layer 3 includes a first inorganic barrier layer 31 and a second inorganic barrier layer 32 that are spaced apart from each other. The packaging structure of the OLED device includes the first inorganic barrier layer 31, an organic sealing layer 4, a sacrificial protective layer 5, and the second inorganic barrier layer 32, which are orderly laminated to one another.

In one embodiment, a physical property of the sacrificial protective layer is greater than a physical property of the organic sealing layer, and the physical property is, for example, density, hardness, elasticity modulus, and the like. For example, the density, the hardness, and/or the elasticity modulus of the sacrificial protective layer are greater than the density, the hardness, and/or the elasticity modulus of the organic sealing layer. The physical properties are not limited thereto. As compared with the organic sealing layer, the physical properties may make the sacrificial protective layer more resistant to bombardment.

In one embodiment, the sacrificial protective layer 5 may be made of an organic material. The sacrificial protective layer 5 is made of hexamethyldisiloxane (HMDSO) or acrylic or epoxy resin. The HMDSO material may form a film by using Plasma Enhanced Chemical Vapor Deposition (PECVD) to obtain a thin film with a thickness of 2 μm or less, thereby reducing the thickness of the packaging layer and improving bending performance of the display device. The acrylic or the epoxy resin may be formed by an inkjet printing to keep in consistence with the method for preparing the organic sealing layer 4, to save equipment investment and reduce production cost. Wherein the organic sealing layer is used to cover the particles generated in the process of manufacturing the OLED device, to reduce the defects caused by the particle impurities. The sacrificial protective layer is made of an organic material and is disposed on the organic sealing layer, to further avoid surface damage or carbonization caused by bombardment of high-energy particles (plasma) against the organic sealing layer in subsequent manufacturing processes.

In one embodiment, the sacrificial protective layer 5 has a length and a width larger than that of the organic sealing layer 4 in close contact with the sacrificial protective layer 5, that is, the length and width of the sacrificial protective layer 5 are larger than the length and width of the organic sealing layer 4 located in the interior of the sacrificial protective layer 5 by 10 μm-50 μm, respectively. The sacrificial protective layer 5 has a thickness in a range of 1 μm to 4 μm. For example, the sacrificial protective layer 5 is designed to be as small as possible to reduce the frame size of the display device product as possible.

In the packaging structure of the OLED device, the first inorganic barrier layer 31 and the second inorganic barrier layer 32 are made of SiNx, SiON, or SiO$_2$, and are formed by the PECVD. The first inorganic barrier layer 31 and the second inorganic barrier layer 32 may also be made of metal oxides. For example, the inorganic barrier layer may be formed by metal oxides such as aluminum oxide and zirconium oxide that are deposited by an Atomic Layer Deposition (ALD).

In the packaging structure of the OLED device, the organic sealing layer 4 is made of the acrylic material and formed by an inkjet printing process. The organic sealing layer 4 has good bendability, transmittance and elasticity, and also has stable chemical properties and process properties.

This embodiment further provides an OLED device including an OLED light-emitting structure 2. The foresaid packaging structure of the OLED device is provided at a periphery of the OLED light-emitting structure 2.

Thus, during preparation of the OLED device, the following process flow may be performed:

S1): forming an OLED light-emitting structure 2;

A light-emitting layer (EL), a cathode layer, a capping layer (CPL), and the like are orderly deposited over the substrate 1 of a thin film transistor prepared with a control element, wherein the CPL is made of lithium fluoride (LiF) for mediating a micro-cavity structure to enhance a light emission of the light-emitting layer.

S2): forming a first inorganic barrier layer 31;

The first inorganic barrier layer 31 is formed by a PECVD process and made of one or more materials of SiNx, SiON, and SiO$_2$.

S3): forming an organic sealing layer 4;

The organic sealing layer 4 is formed by an inkjet printing process and using an acrylic material. The thickness of the organic sealing layer 4 is in the range of 4 μm to 10 μm. The organic sealing layer 4 is thicker and is used to cover the particles produced in the process of manufacturing the OLED device, so as to reduce the packaging defects caused by the particle impurities.

S4): forming a sacrificial protective layer 5;

A planar size of the sacrificial protective layer 5 is not smaller than a planar size of the organic sealing layer 4, for example, the length or width of the sacrificial protective layer 5 is greater than the length or width of the organic sealing layer 4 by 10 μm to 50 μm respectively, and the thickness of the sacrificial protective layer 5 is in a range of 1 μm-4 μm.

The material of the sacrificial protective layer 5 may be identical to or different from the material of the organic sealing layer 4. In one embodiment, the sacrificial protective layer 5 is formed by a PECVD or the inkjet printing process and using any one material of HMDSO, acrylic, and epoxy resin.

S5): forming a second inorganic barrier layer 32.

The second inorganic barrier layer 32 is formed by PECVD and using one or more materials of SiNx, SiON and $SiO_2$.

So far, the OLED light-emitting structure 2 is packaged to form an OLED device.

As for the packaging structure of the OLED device in this embodiment, the sacrificial protective layer for protecting the organic sealing layer is manufactured after the organic sealing layer, to protect the organic sealing layer from being damaged by the high-energy particles in the subsequent PECVD, so as to improve a sealing effect of the thin film package.

The Second Embodiment

This embodiment provides a packaging structure of an OLED device. The packaging structure of the OLED device has a better effect of packaging the OLED device.

Figure 2:
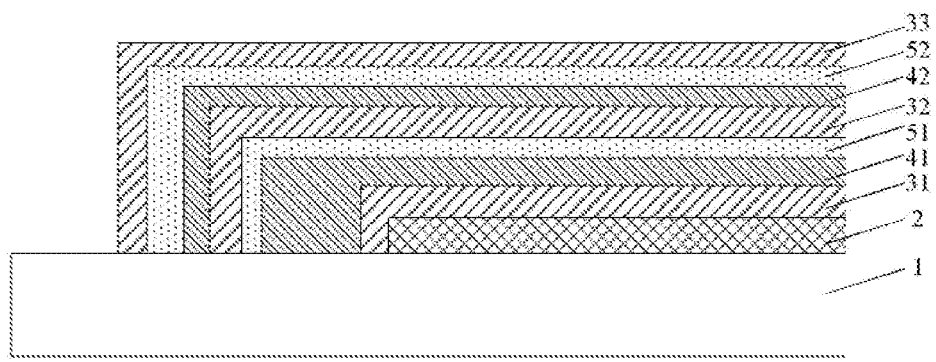
FIG. 2 is a schematic structural view of an OLED device according to a second embodiment of the present disclosure.

As compared with the packaging structure of the OLED device in the first embodiment, various functional film layers in the packaging structure of the OLED device of this embodiment has a complicated layering and a better sealing effect. As shown in FIG. 2, in the packaging structure of the OLED device, the inorganic barrier layer includes a first inorganic barrier layer 31, a second inorganic barrier layer 32, and a third inorganic barrier layer 33 that are spaced apart from one another. The organic sealing layer 4 includes a first organic sealing layer 41 and a second organic sealing layer 42 which are spaced apart from each other. The sacrificial protective layer includes a first sacrificial protective layer 51 and a second sacrificial protective layer 52 that are spaced apart from each other. The packaging structure of the OLED device includes the first inorganic barrier layer 31, the first organic sealing layer 41, the first sacrificial protective layer 51, the second inorganic barrier layer 32, the second sacrificial protective layer 52, and the third inorganic barrier layer 33 which are laminated with one another.

In one embodiment, the first sacrificial protective layer 51 and the second sacrificial protective layer 52 are made of hexamethyldisiloxane (HMDSO) or acrylic or epoxy resin. The HMDSO material may form a film by using the PECVD to obtain a thin film with a thickness of 2 μm or less, thereby reducing the thickness of the packaging layer and improving bending performance of the display device. The acrylic or the epoxy resin may be formed by an inkjet printing to keep in consistence with the method for preparing the organic sealing layer 4, to save equipment investment and reduce production cost.

In one embodiment, the first sacrificial protective layer 51 and the second sacrificial protective layer 52 have a length and a width larger than that of the organic sealing layer that is adjacent to the first sacrificial protective layer 51 and the second sacrificial protective layer 52, that is, the length and width of the sacrificial protective layer are larger than the length and width of the organic sealing layer located in the interior of the sacrificial protective layer by 10 μm-50 μm, respectively. The sacrificial protective layer has a thickness in a range of 1 μm to 4 μm. Generally, the sacrificial protective layer is designed to be as small as possible to avoid increasing the frame size of the display device product.

In the packaging structure of the OLED device, the first inorganic barrier layer 31, the second inorganic barrier layer 32 and the third inorganic barrier layer 33 are made of SiNx, SiON, or $SiO_2$, and by using the PECVD. Of course, the first inorganic barrier layer 31, the second inorganic barrier layer 32 and the third inorganic barrier layer 33 may also be made of metal oxides. For example, the inorganic barrier layer may be formed by metal oxides such as aluminum oxide and zirconium oxide that are deposited by an Atomic Layer Deposition (ALD).

In the packaging structure of the OLED device, the first organic sealing layer 41 and the second organic sealing layer 42 are made of the acrylic material and formed by an inkjet printing process. The first organic sealing layer 41 and the second organic sealing layer 42 have good bendability, transmittance and elasticity, and also have stable chemical properties and process properties.

This embodiment further provides an OLED device including an OLED light-emitting structure 2. The foresaid packaging structure of the OLED device is provided at a periphery of the OLED light-emitting structure 2.

Thus, during preparation of the OLED device, the following process flow may be performed:

S1): forming an OLED light-emitting structure 2;

A light-emitting layer (EL), a cathode layer, a capping layer (CPL), and the like are orderly deposited over the substrate 1 of a thin film transistor prepared with a control element, wherein the CPL is made of lithium fluoride (LiF) for mediating a micro-cavity structure to enhance a light emission of the light-emitting layer.

S2): forming a first inorganic barrier layer 31;

The first inorganic barrier layer 31 is formed by a PECVD process and using one or more materials of SiNx, SiON, and $SiO_2$.

S3): forming a first organic sealing layer 41;

The first organic sealing layer 41 is formed by an inkjet printing process and made of an acrylic material. The thickness of the first organic sealing layer 41 is in the range of 4 μm to 10 μm.

S4): forming a first sacrificial protective layer 51;

A planar size of the first sacrificial protective layer 51 is not smaller than a planar size of the first organic sealing layer 41, for example, the length or width of the first sacrificial protective layer 51 is greater than the length or width of the first organic sealing layer 41 by 10 μm to 50 μm respectively, and the thickness of the first sacrificial protective layer 51 is in a range of 1 μm-4 μm.

The material of the first sacrificial protective layer 51 may be identical to or different from the material of the first organic sealing layer 41. In one embodiment, the first sacrificial protective layer 51 is formed by a PECVD or the inkjet printing process and made of any one material of HMDSO, acrylic, and epoxy resin.

S5): forming a second inorganic barrier layer 32;

The second inorganic barrier layer 32 is formed by PECVD and using one or more materials of SiNx, SiON and $SiO_2$.

S6): forming a second organic sealing layer 42;

The second organic sealing layer 42 is formed by an inkjet printing process and made of an acrylic material. The thickness of the second organic sealing layer 42 is in the range of 4 μm to 10 μm.

S7): forming a second sacrificial protective layer 52;

A planar size of the second sacrificial protective layer 52 is not smaller than a planar size of the second organic sealing layer 42, for example, the length or width of the second sacrificial protective layer 52 is greater than the length or width of the second organic sealing layer 42 by 10 μm to 50 μm respectively, and the thickness of the second sacrificial protective layer 52 is in a range of 1 μm-4 μm.

The material of the second sacrificial protective layer 52 may be identical to or different from the material of the second organic sealing layer 42. In one embodiment, the second sacrificial protective layer 52 is formed by a PECVD or the inkjet printing process and made of any one material of HMDSO, acrylic, and epoxy resin.

S8): forming a third inorganic barrier layer 33.

The third inorganic barrier layer 33 is formed by PECVD and made of one or more materials of SiNx, SiON and SiO$_2$.

So far, the OLED light-emitting structure 2 is packaged to form an OLED device.

As for the packaging structure of the OLED device in this embodiment, the sacrificial protective layers for protecting the organic sealing layer are manufactured respectively after the first organic sealing layer and the second organic sealing layer, to protect the organic sealing layer from being damaged by the high-energy particles in the subsequent PECVD, so as to improve a sealing effect of the thin film package.

The Third Embodiment

This embodiment provides an OLED device. The OLED device includes an OLED light-emitting structure. The OLED light-emitting structure is encapsulated by a packaging structure of the OLED device according to any one of the first and second embodiments.

The OLED device may be: any one product or component with a display function, such as a desktop computer, a tablet computer, a notebook computer, a mobile phone, a PDA, a GPS, a car-carried display, a projection display, a video camera, a digital camera, an electronic watch, a calculator, an electronic instrument, a meter, a television, a display, a digital photo frame, and a navigator, and may be used in many areas such as public displays and virtual displays.

With the packaging structure of the OLED device according to the present disclosure, the sacrificial protective layer is disposed before and closely adjacent to the organic sealing layer, to protect the organic sealing layer in the manufacturing process, the high-energy particles are laminated on the sacrificial protection layer. The sacrificial protection layer, even if being damaged by the external force, can effectively protect the integrity of a chemical valence bond structure of the organic sealing layer material, so as to protect the organic sealing layer from being damaged and improve the packaging effect of the OLED device.

It should be understood that the above embodiments are merely exemplary implementations as adopted for explaining the principle of the present disclosure, but the present disclosure is not limited thereto. For those skilled in the art, various variations and improvements may be made without departing from the spirit and essence of the present disclosure, and these variations and improvements are also considered to be within the protection scope of the present disclosure.

What is claimed is:

1. A packaging structure for encapsulating an OLED light-emitting structure in an OLED device, the packaging structure comprising:
    inorganic barrier layers;
    an organic sealing layer that is laminated with the inorganic barrier layers;
    a sacrificial protective layer that is disposed on one side of the organic sealing layer distal to the OLED light-emitting structure and is in close contact with the one side of the organic sealing layer, wherein the other side of the organic sealing layer close to the OLED light-emitting structure is in close contact with one of the inorganic barrier layers and is not in close contact with the sacrificial protective layer;
    wherein the outermost layer of the packaging structure is another one of the inorganic barrier layers;
    the inorganic barrier layers comprise a first inorganic barrier layer and a second inorganic barrier layer that are spaced apart from each other;
    the first inorganic barrier layer, the organic sealing layer, the sacrificial protective layer and the second inorganic barrier layer are orderly laminated to one another;
    at least one of density, hardness, and elasticity modulus of the sacrificial protective layer are greater than at least one of density, hardness, and elasticity modulus of the organic sealing layer;
    the sacrificial protection layer is formed by using any one organic material of HMDSO, an acrylic and an epoxy resin; and
    the sacrificial protection layer is used for avoiding surface damage or carbonization caused by bombardment of high-energy particles against the organic sealing layer in subsequent manufacturing processes.

2. The packaging structure of an OLED device according to claim 1, wherein the inorganic barrier layers further comprise a third inorganic barrier layer spaced apart from the first inorganic barrier layer and the second inorganic barrier layer; the organic sealing layer comprises a first organic sealing layer and a second organic sealing layer that are spaced apart from one another; the sacrificial protective layer comprises a first sacrificial protective layer and a second sacrificial protective layer that are spaced apart from each other;
    the first inorganic barrier layer, the first organic sealing layer, the first sacrificial protective layer, the second inorganic barrier layer, the second organic sealing layer, the second sacrificial protective layer, and the third inorganic barrier layer which are orderly laminated with one another.

3. The packaging structure of an OLED device according to claim 1, wherein the sacrificial protective layer covers the organic sealing layer, and the second inorganic barrier layer covers the sacrificial protective layer.

4. The packaging structure of an OLED device according to claim 1, wherein the inorganic barrier layers are made of an aluminum oxide or a zirconium oxide.

5. The packaging structure of an OLED device according to claim 1, wherein the inorganic barrier layers are made of one or more materials of SiNx, SiON and SiO.

6. The packaging structure of an OLED device according to claim 1, wherein the organic sealing layer is made of the acrylic.

7. The packaging structure of an OLED device according to claim 1, wherein the organic sealing layer is formed by an inkjet printing.

8. An OLED device, comprising an OLED light-emitting structure and a packaging structure for encapsulating the OLED light-emitting structure, wherein the packaging structure comprises:

inorganic barrier layers;

an organic sealing layer that is laminated with the inorganic barrier layers;

a sacrificial protective layer that is disposed on one side of the organic sealing layer distal to the OLED light-emitting structure and is in close contact with the one side of the organic sealing layer, wherein the other side of the organic sealing layer close to the OLED light-emitting structure is in close contact with one of the inorganic barrier layers and is not in close contact with the sacrificial protective layer;

wherein the outermost layer of the packaging structure is another one of the inorganic barrier layers;

the inorganic barrier layers comprise a first inorganic barrier layer and a second inorganic barrier layer that are spaced apart from each other;

the first inorganic barrier layer, the organic sealing layer, the sacrificial protective layer and the second inorganic barrier layer are orderly laminated to one another;

at least one of density, hardness, and elasticity modulus of the sacrificial protective layer are greater than at least one of density, hardness, and elasticity modulus of the organic sealing layer;

the sacrificial protection layer is formed by using any one organic material of HMDSO, an acrylic and an epoxy resin; and the sacrificial protection layer is used for avoiding surface damage or carbonization caused by bombardment of high-energy particles against the organic sealing layer in subsequent manufacturing processes.

* * * * *